United States Patent [19]

Conger et al.

[11] Patent Number: 4,761,269

[45] Date of Patent: Aug. 2, 1988

[54] APPARATUS FOR DEPOSITING MATERIAL ON A SUBSTRATE

[75] Inventors: Darrell R. Conger, Portland; John G. Posa; Dennis K. Wickenden, both of Lake Oswego, all of Oreg.

[73] Assignee: Crystal Specialties, Inc., Portland, Oreg.

[21] Appl. No.: 873,581

[22] Filed: Jun. 12, 1986

[51] Int. Cl.[4] .................. C30B 35/00; C23C 16/54
[52] U.S. Cl. ................... 422/245; 422/247; 118/715; 118/679
[58] Field of Search ..... 156/610, 611, 613, DIG. 113; 432/198, 200; 118/715, 719, 720, 679, 725; 422/245

[56] References Cited

U.S. PATENT DOCUMENTS

| | | | |
|---|---|---|---|
| 3,306,768 | 2/1967 | Peterson | 427/255.3 |
| 3,652,444 | 2/1972 | Lester et al. | 204/298 |
| 3,850,679 | 11/1974 | Sopko et al. | 118/48 |
| 3,930,908 | 1/1976 | Jolly | 156/613 |
| 4,066,481 | 1/1978 | Manasevit et al. | 156/613 |
| 4,204,893 | 5/1980 | Cox | 118/725 |
| 4,279,670 | 7/1981 | Steele | 156/610 |
| 4,369,031 | 1/1983 | Goldman et al. | 118/715 |
| 4,439,267 | 3/1984 | Jackson, Jr. | 156/614 |
| 4,446,817 | 5/1984 | Crawley | 118/730 |
| 4,448,797 | 5/1984 | Burnham | 156/613 |
| 4,476,158 | 10/1984 | Baumberger et al. | 118/315 |
| 4,533,410 | 8/1985 | Ogura et al. | 156/612 |
| 4,566,918 | 1/1986 | Irvine et al. | 156/613 |

FOREIGN PATENT DOCUMENTS

| | | | |
|---|---|---|---|
| 2397876 | 3/1979 | France | 156/613 |
| 0128299 | 7/1984 | Japan | 156/613 |

OTHER PUBLICATIONS

Betsch, R., "Parametric Analysis of Control Parameters in MOCVD", Proc. 3rd *Int. Conf. Metalorg. Vapor Phase Epitaxy*, Apr., 1986, pp. 210-218.

Roth et al., "Characterization of Gax Ini-xAs/GaAs Heterostructures Grown by Low Pressure MOVPE", Proc. 3rd *Int. Conf. Metalorg. Vapor Phase Epitaxy*, Apr., 1986, pp. 571-578.

Roberts et al., "Factors Influencing Doping Control", J. Crys. Growth 68, (1984), pp. 425-426.

Dapkus, P. Daniel, "Metal Organic Chemical Vapor Deposition," Annual Review of Material Sciences, vol. 12, (1982), 243, 269.

(List continued on next page.)

*Primary Examiner*—John Doll
*Assistant Examiner*—R. Bruce Breneman
*Attorney, Agent, or Firm*—Klarquist, Sparkman, Campbell, Leigh & Whinston

[57] ABSTRACT

An apparatus for depositing materials on a substrate includes a manifold having a plurality of inlet valves located equidistantly from the manifold outlet. Preferably the inlet valves are mounted in radial configuration to minimize any "dead space" between the valves and the manifold outlet. The manifold connects a plurality of gas sources through its inlets to a process chamber at its outlet. The valves within the manifold switch continuous reactive gas flows from the sources back and forth between the process chamber and a vent chamber during the deposition process. A purging gas flow is also provided at each valve to purge the "dead space" within the manifold of reactive gases that can linger once the reactive gas flow has been switched to the vent. The method employed by the apparatus maintains a predetermined constant gas flow through the process chamber to produce uniform deposition on the substrate. Reactive and nonreactive gas flows are injected into the process chamber at a rate sufficient to maintain the predetermined flow. After each deposition step, reactive gas flows are switched into and out of the process chamber and the nonreactive gas flows are adjusted in response to maintain a constant total flow. The vent chamber is maintained at substantially equal pressure to the process chamber to minimize fluctuations in reactive gas flows as the flows are switched between chambers.

15 Claims, 4 Drawing Sheets

OTHER PUBLICATIONS

Westphal et al., "A Flow Channel Reactor for GaAs Vapor Phase Epitaxy," Journal of Crystal Growth, vol. 56, (1982), 324–331.

Weitzel et al., "A Comparison of GaAs and Si Processing Technology," Semiconductor International, (Jun. 1982), 73–89.

Johnsen, Gregory, "Gallium Arsenide Chips Emerge from the Lab," High Technology, (Jul. 1984), 44–52, page titled Resources.

Korde, R. S., "Some Notes on the Current Aspects of MOCVD," 2 pp.

Brody, Herb, "Ultrafast Chips at the Gate," High Technology, (Mar. 1986), 28–34, 70.

APPARATUS FOR DEPOSITING MATERIAL ON A SUBSTRATE

BACKGROUND OF THE INVENTION

This invention relates to a method and apparatus for depositing material on a substrate using a chemical vapor deposition process. More particularly, the invention relates to such a method and apparatus for producing multilayered structures of extreme thinness and sharp transitions between layers.

Chemical vapor deposition processes have long been used for depositing material on a substrate, such as in the fabrication of semiconductor devices. One such process, metalorganic chemical vapor deposition (MOCVD), is preferred for the fabrication of many high performance electronic and optoelectronic devices because it can utilize aluminum, which the other processes cannot do. In addition, the inherent characteristics of metalorganic chemical vapor deposition make it ideally suited for growing epitaxial layers, which are inevitably involved in new device structures.

In the growth process with metalorganic chemical vapor deposition, one or more film constituents are transported to a reaction zone in a form of gaseous reactants. The metalorganic reactant is contained in a bubbler through which a carrier gas is bubbled to vaporize the metalorganic for transport to the reaction zone. The desired compound forms as a layer on the substrate via the pyrolysis of the reactants and the subsequent recombination of the atomic or molecular species on the heated substrate. The growth process can be controlled by fixing the flow rates and thereby relative proportions of the various gaseous reactants with electronic mass flow controllers. Complex, multilayer epitaxial structures are formed by exchanging one gas composition for another using conventional gas-mixing systems.

Current chemical vapor deposition apparatrs, commonly known as reactors, include a deposition chamber or vessel for housing the substrate, a gas mixing manifold, and a heat source such as an inductively coupled RF generator. The chamber is typically one of two configurations: a vertical bell jar usually employed for commercial, high volume production and a horizontal cylindrical tube preferred for research. A graphite susceptor for supporting the substrate is mounted in the chamber for positioning the substrate at a desired angle to the reactive gas flow. Examples of such chambers are disclosed in U.S. Pat. No. 3,306,768 to Peterson, U.S. Pat. No. 3,850,679 to Sopko et al., U.S. Pat. No. 4,066,481 to Manasevit, U.S. Pat. No. 4,369,031 to Goldman et al., U.S. Pat. No. 4,446,817 to Crawley, and in P. Daniel Dapkus, "Metal Organic Chemical Vapor Deposition," *Annual Review of Material Sciences* 1982, Vol. 12, pp. 243, 269.

One drawback of these conventional chamber designs is their inability to concentrate the flow of reactants near the surface of the substrate. The relatively large volume of the chamber encourages a turbulent flow of the gases from the chamber's inlet to its outlet, leading to a nonuniform deposition. The large volume also results in a low velocity of gas flow across the substrate, causing further nonuniformity in the deposition as the reactants deposit at the leading edge of the substrate.

The second component of most deposition apparatus, the gas-mixing manifold, directs gas flow from a number of sources into the chamber. The conventional manifold is typically a linear array of gas flow lines constructed from stainless steel tubing, connecting the various gas sources to the chamber inlet. Inlet valves are positioned in the flow lines for sequentially introducing different reactive gases into the chamber. An electronic mass flow controller controls the flow of gas in each line. The mass flow rates and sequencing of the valves are controlled by a central processor, which automates the growth of complex multilayer material structures.

The conventional manifold, although adequate for producing less advanced devices, cannot control reactive gas flows accurately enough to produce the sharp transitions in composition between layers demanded by today's high speed solid-state devices. The reactive gases tend to linger in any "dead space" or volume of the manifold downstream of the respective inlet valve. These gases gradually disperse into the chamber to contaminate the following deposition layer. The result is a gradual rather than sharp transition between layers. The manifold of Peterson, for example, employs flow meters and valves to control each reactive gas flow, but between the valves and the process chamber is a large volume from which reactants can disperse into the chamber even after the flow is shut off by the flow meter. The same drawback is apparent in other apparatus such as that of Sopko et al. and Manasevit, both which use a linear manifold for injecting the reactive gases into the chamber. The inlet valve in each gas line is located a different distance from the outlet of the manifold, compounding the problem because the volume of "dead space" for each reactive gas differs. Other manifolds with similar drawbacks are disclosed in Goldman et al., Crawley, U.S. Pat. No. 4,279,670 to Steele, and U.S. Pat. No. 4,476,158 to Baumberger et al.

Much development in chemical vapor deposition has concentrated on improving the deposition method. Peterson, one of the earliest patents in the field, is directed to a process for coating a substrate with an oxide film while keeping the substrate at a relatively low temperature. Sopko et al. is directed to a method of coating a substrate by vaporizing the reactant and directing it through a nozzle against the substrate.

These and the other methods, however, have not been able to control precisely the uniform thickness of the deposited layers because they do not maintain a constant flow and thus a constant pressure through the process chamber. Constant flow and pressure are difficult to maintain in the face of the continuous switching of different reactants into and out of a chamber. Each reactive gas may have a different flow rate requiring compensating change in flow elsewhere to maintain a constant total gas flow into the process chamber. Pressure can also build in gases that are held behind closed valves, causing flow surges when the gas is eventually switched into the chamber. This pressure build-up is especially a problem in the MOCVD process, where pressure buildup within the bubbler can cause large bubbles to form and disrupt the reactive gas flow. The apparatus disclosed in Manasevit minimizes this pressure surge somewhat by directing gas flows to an exhaust rather than terminating them when they are not called for in the deposition process. However, Manasevit does not compensate for the effect of a varying reactive gas flow on the uniformity of deposition.

SUMMARY OF THE INVENTION

An object of the invention, therefore, is to provide an improved method and apparatus for depositing material on a substrate using a chemical vapor deposition process.

Another object of the invention is to minimize the adverse effect of "dead space" within the apparatus.

A further object of the invention is to purge the apparatus of any lingering reactive gas before deposition of a successive layer.

Another object of the invention is to control precisely the sharpness of transitions at a heterojunction between layers and the layer thicknesses.

Another object of the invention is to maintain a constant flow of gases through the deposition chamber to produce uniform deposition on the substrate.

Yet another object of the invention is to maintain a constant pressure in the deposition chamber as gases are switched into and out of the apparatus during the deposition process.

To achieve these objects an apparatus for depositing materials on a substrate includes a process chamber, a plurality of gas sources, and a manifold means for directing gas flows from each gas source to the process chamber. The manifold means has a plurality of inlets for receiving the gas flow and an outlet to the process chamber. Between each of the inlets and the outlet of the manifold means is an inlet valve means for switching the gas flow from each gas source into and out of the process chamber. Each inlet valve means is located equidistantly from the outlet so that any "dead space" within the manifold downstream of each inlet valve is the same. Preferably, the manifold means is a radial manifold comprising inlets extending radially through the manifold to communicate with the outlet at a common location. The outlet extends axially within the manifold to the common location. The radial configuration equalizes the "dead space" among reactant inlets within the manifold.

In one aspect of the invention, the manifold means includes vent means in communication with the inlet valve means for venting the respective gas flow away from the process chamber in response to actuation of the inlet valve means. The vent means enables the gas to flow continuously and thereby minimizes pressure fluctuations in the flow as it is switched into and out of the process chamber during the deposition process.

Another aspect of the invention provides a first inlet for receiving a reactive gas and an associated second inlet for receiving a purging gas, both in communication with the manifold outlet at the valve means. When the reactive gas flow is switched away from the process chamber and into the vent means by actuation of the inlet valve means, the purging gas flow from the second inlet replaces the reactive flow to purge any "dead space" within the manifold means of lingering reactive gas. The apparatus may also include control means for controlling the second inlet gas flow. The control means maintains a constant gas flow through each inlet valve means by adjusting the purging gas flow to compensate for reactive gas flow that is switched between the process chamber and the vent means.

To aid in maintaining a constant pressure within the process chamber during the deposition, the apparatus may include a vent chamber and means for maintaining the vent chamber at a pressure substantially equal to the pressure within the process chamber.

A method of operation in accordance with the invention produces a constant total flow of gas and therefore a constant pressure in the process chamber to improve the uniformity of deposition on the substrate. The method includes injecting at least one reactive gas flow into the process chamber and an associated nonreactive gas flow therewith at a rate sufficient to maintain a predetermined, constant gas flow through each inlet valve means. As a deposition layer is completed, any reactive gas no longer required is switched out of the process chamber and the associated nonreactive gas flow is compensatingly adjusted in response to maintain the predetermined flow through each valve means.

The foregoing and other objects, features, and advantages of the invention will become more apparent from the following detailed description of the preferred embodiments which proceeds with reference to the accompanying drawings.

DETAILED DESCRIPTION

The Apparatus

Figure 1:
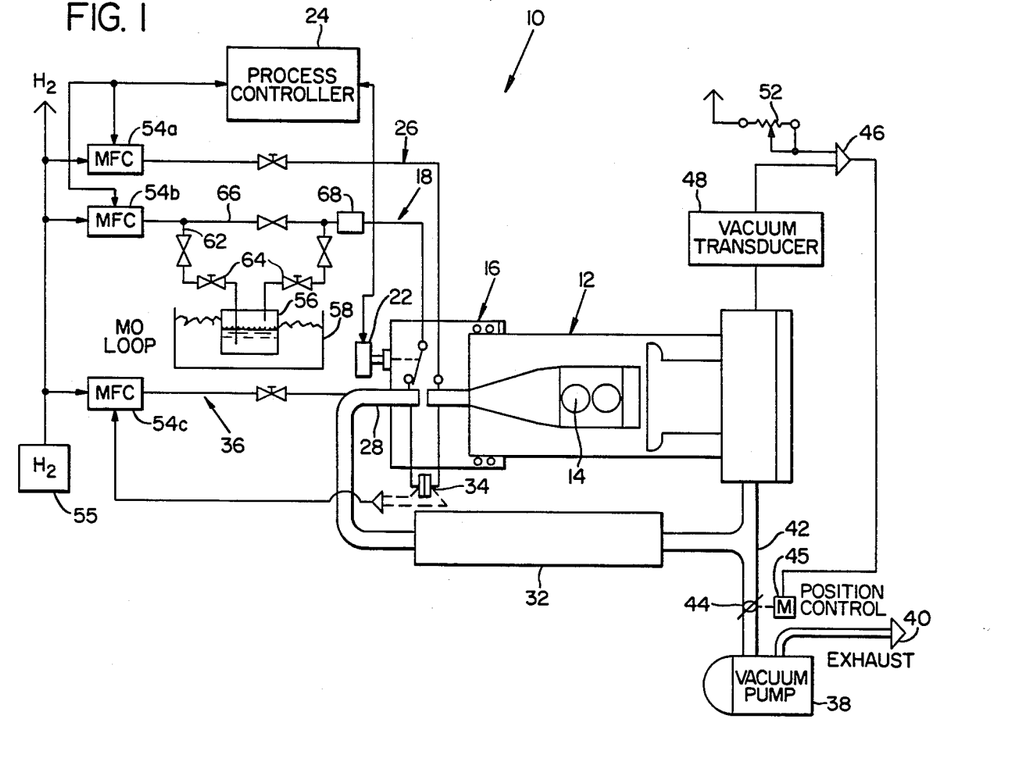
FIG. 1 is a schematic diagram of a chemical vapor deposition apparatus according to the invention.

FIG. 1 is a schematic diagram of a system or apparatus 10 according to the invention for depositing materials onto a substrate. The apparatus 10 includes a process or reaction chamber 12 that houses a substrate 14 on which epitaxial layers are grown according to a number of known processes, such as metalorganic chemical vapor deposition (MOCVD). The materials that form these layers are carried by reactive gases from a plurality of sources such as a source 18 that injects a gas flow into the process chamber through a manifold 16. The gas flow from the gas source 18 is switched into and out of the process chamber 12 by an inlet valve 22 monitored and controlled by a process controller 24 such as a programmed microcomputer. A nonreactive gas source 26 also injects a gas flow through the manifold 16 to purge the manifold of gas from the source 18. The gas source 18 shown is derived by bubbling a carrier gas through a liquid source. Alternatively, the source 18 may represent any of a number of reactive gas sources such as a gaseous or "hydride" type source that does not require the metalorganic bubbler and bath described below.

The reactive gas flow, when switched out of the process chamber 12 by the valve 22, is directed through a vent means such as a vent 28 and a vent chamber 32, as indicated in FIG. 1. The pressure within the vent chamber 32 is maintained substantially equal to the pressure within the process chamber 12, so that the flow of reactive gas from the source 18 is not disrupted as that gas flow is switched back and forth between the two chambers. Any pressure difference between the chambers 12 and 32 is sensed in feedback by a pressure transducer 34 such as a differential capacitance manometer. The transducer 34 senses pressure in both chambers and in response controls a compensating source 36 that injects a compensating gas flow into the vent chamber 32. Alternatively, the transducer may control a throttle valve (not shown) to constrict the vent 28.

The pressures within the two chambers 12 and 32 are controlled by a vacuum pump 38 that evacuates the gases within the chambers to an exhaust 40. The outlets of these chambers 12 and 32 join at a common conduit 42 to which the pump 38 is connected. The suction of the pump 38 is controlled by throttle valve 44 within the conduit 42 via a position control 45. The setting of the control 45 in turn is controlled by a comparator 46. The comparator 46 compares the pressure within the chamber 12 sensed by a vacuum transducer 48 such as a capacitance manometer against a reference value provided by an adjustable reference source 52. The comparator 46 in response generates a continuous control signal to the position control 45 to set the valve 44 at the appropriate setting for maintaining the reference pressure.

Considering the makeup of gas sources 18, 26, and 36 in more detail, the flow of gas from each type of gas source is controlled by conventional mass flow controllers 54 through 54c under the direction of process controller 24 in a manner to be described in the method of operation. The purging gas source 26 and the compensating gas source 36 provide a flow of nonreactive gas such as hydrogen from a source 55. In FIG. 1, the gas source 18 represents a metalorganic compound through which a carrier gas such as hydrogen is bubbled to inject the compound in vapor form into the process chamber 12. The compound is contained in a conventional bubbler comprising a stainless steel ampule 56 immersed in a conventional temperature-controlled recirculating bath 58 which controls precisely the vapor pressure of the immersed compound. A feed line 62 into and out of the ampule 56 contains a series of valves 64 for stopping the flow of gas when the ampule is to be changed. The gas source also includes in line 66 a back-pressure regulator 68 to maintain a constant pressure within the ampule 56 as pressures elsewhere within the apparatus 10 vary during the deposition process. The pressure within the ampule 56 is preferably maintained at approximately atmospheric pressure to prevent the formation of large bubbles that could disrupt the reactive gas flow.

Figure 2:
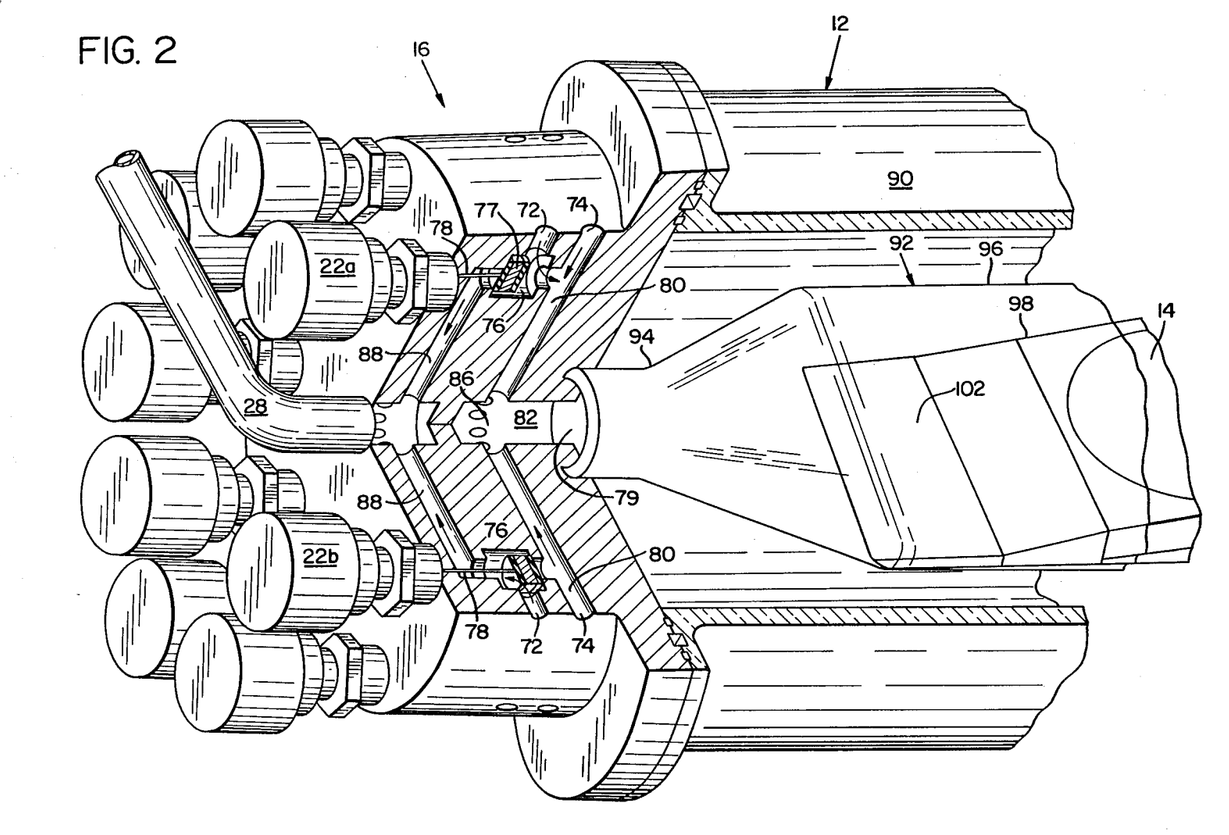
FIG. 2 is a perspective view, partly in section, of a manifold and a portion of a process chamber employed in the apparatus of FIG. 1.

FIG. 2 shows a perspective view, partly in section, of the manifold 16 and a portion of the process chamber 12. A plurality of conventional bellows switching valves 22a, 22b such as the three-way BY switching valve manufactured by Nupro Valve Company of Willoughby, Ohio, are mounted on the manifold 16 in a radial fashion. Associated with each valve are first and second manifold inlets 72 and 74 for receiving gas flows from the sources 18 and 26, respectively. Inlet 72 communicates with a valve cavity 76 within which a valve member 77 connected to an actuating rod 78 is contained to switch the reactive gas flow between a manifold outlet 79 to the process chamber 12 and the vent 28. A first outlet from the valve cavity 76 communicates with an inlet path 80 that extends radially inward of the manifold 16 to an outlet path 82. The path 82 extends axially through the manifold to the manifold outlet 79. As can be seen in FIG. 2, each of the several inlet paths 80 are of equal length and meet at a common location 86 in the outlet path 82. Each of the valves 22 therefore is equidistant from the common location 86 and thus equidistant from the manifold outlet 79. The "dead space," consisting of the length of the first outlet from valve cavity 76 and the portion of inlet path 80 within the manifold 16 downstream (i.e. radially inward) of the valve 22, is the space in which reactive gas can linger once its flow to a process chamber is terminated. The radial configuration of the valves minimizes this space and equalizes it for each reactive gas flow.

The reactive gas flow that is switched out of the process chamber 12 is diverted through a second outlet of the valve cavity 76 to a vent path 88 that leads to the vent 28. The valve 22b is shown with its valve member 78 set to divert the reactive gas flow through the inlet 72 into the vent path 88 while the member maintains the flow of the nonreactive gas through associated inlet 74 into the inlet path 80. The valve 22a, on the other hand, is shown with its valve member 78 set to divert the reactive gas flow through inlet 72 into the inlet path 80 to join the nonreactive gas flow through the associated inlet 74 to the chamber 12.

In the process of depositing various types of materials on the substrate 14, the valves 22 are actuated in a predetermined order to switch reactive gas flows back and forth between the vent chamber 32 and process chamber 12. The reactive gases that flow simultaneously into the process chamber 12 combine in the chemical vapor deposition process to produce different depositions on the substrate. Reactive gas that would otherwise remain in the "dead space" after the reactive flow is switched to the vent chamber 32 is immediately swept into the process chamber 12 by the continuous flow of purging, nonreactive gas from the gas source 26. The width and boundaries of the different epitaxial layers can thus be more precisely controlled than a conventional apparatus where reactive gases continue to seep into a process chamber after their flows have been terminated.

In addition to purging the manifold 16 of reactive gas flow, the nonreactive gas flow from the source 26 can be adjusted to maintain a constant gas flow through each inlet path 80 into the process chamber 12. The controller 24 acts as a means for controlling the nonreactive gas flow via the main flow controller 54a or a separate valve (not shown). As the reactive gas through inlet 72 is switched from inlet path 80 to the vent path 88, the process controller 24 increases the nonreactive gas flow through inlet 74 accordingly.

Figure 3:
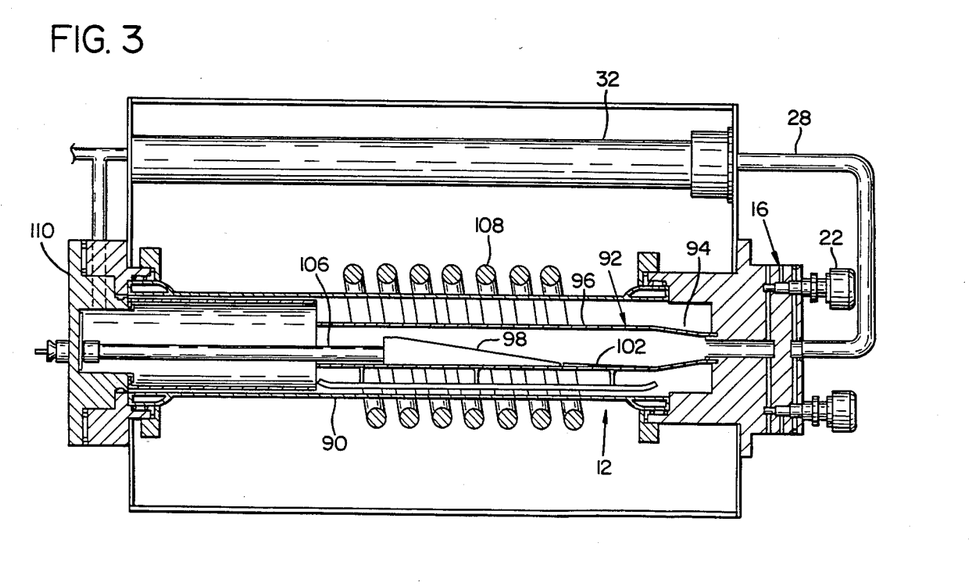
FIG. 3 is a side view of the process chamber of FIG. 2.

A portion of the process chamber 12 is shown in perspective in FIG. 2 and in more detail in FIG. 3. The chamber 12 comprises a quartz cylinder 90 surrounding a removable flow channel 92 coupled to the manifold outlet 79. The walls of the flow channel 92 can be relatively thin despite evacuation with the channel because the space between the flow channel 92 and the cylinder 90 is maintained at less than atmospheric pressure. The flow channel 92 comprises a quartz tube having a divergent inlet section 94 of rectangular cross section for receiving the total gas flow from the manifold outlet 79 and a second parallel-sided longitudinal section 96 for supporting a susceptor carrier 98. The second section 96 and susceptor carrier 98 are mutually shaped to bring the reactive gas flow into close proximity to the substrate 14 to reduce turbulence and maintain a greater velocity over the substrate than provided by more voluminous process chambers. The second section 96 also includes an integral ramp 102 for producing a laminar flow of reactive gases over the leading edge of the substrate 14 mounted within the susceptor carrier 98. This laminar flow encourages a uniform deposition of material across the entire substrate, rather than a deposition gradient that otherwise occurs from the leading edge of the substrate to the rearward portion.

Figure 4:
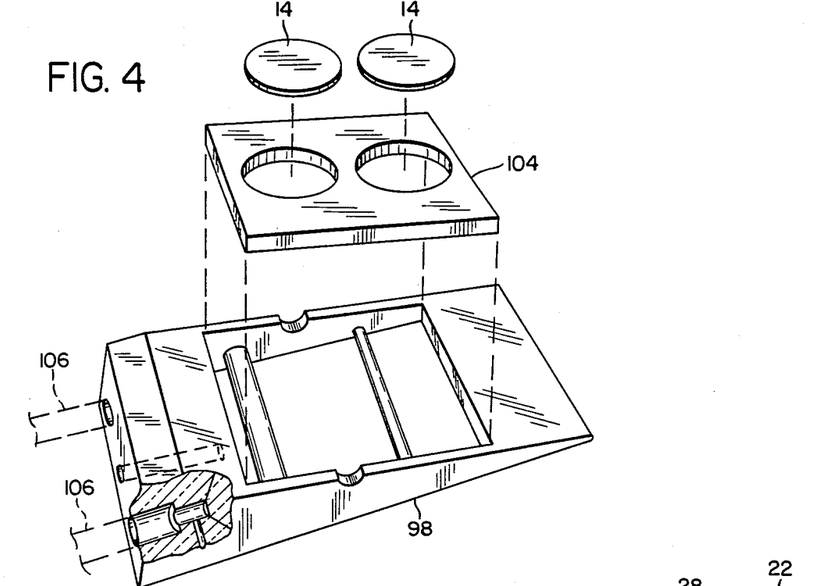
FIG. 4 is an exploded view of a susceptor used in the chamber of FIGS. 2 and 3.

As best seen in FIG. 3, the susceptor carrier 98 has an inclined shape for reducing convection currents and accelerating the reactive gas flow as it passes over the supported substrate 14. The inclined shape narrows progressively the width of the passageway for gas flow within the channel 92. FIG. 4 shows an exploded view of the susceptor carrier 98. The substrate wafers 14 are removably held in a susceptor 104 that itself can be removed from the carrier body. The carrier 98 is inserted and withdrawn from the flow channel 92 by extensible rods 106 connected through the carrier's rear surface.

FIG. 3 also shows a side view of other elements of the apparatus 10. An RF coil 108 (shown in cross section) provides heat for the deposition reaction on the substrate 14 by inductive coupling to the susceptor 104. A load door/thermocouple assembly 110 is of conventional design and provides a hermetic seal to the process chamber 12 and means for inserting and withdrawing the susceptor carrier 98 from the flow channel 92. The vent chamber 32 shown in FIG. 3 is engineered to have a volume similar to that of the active reaction area and, therefore, has substantially the same internal pressure with a gas flow equal to that of the flow channel.

Figure 5:
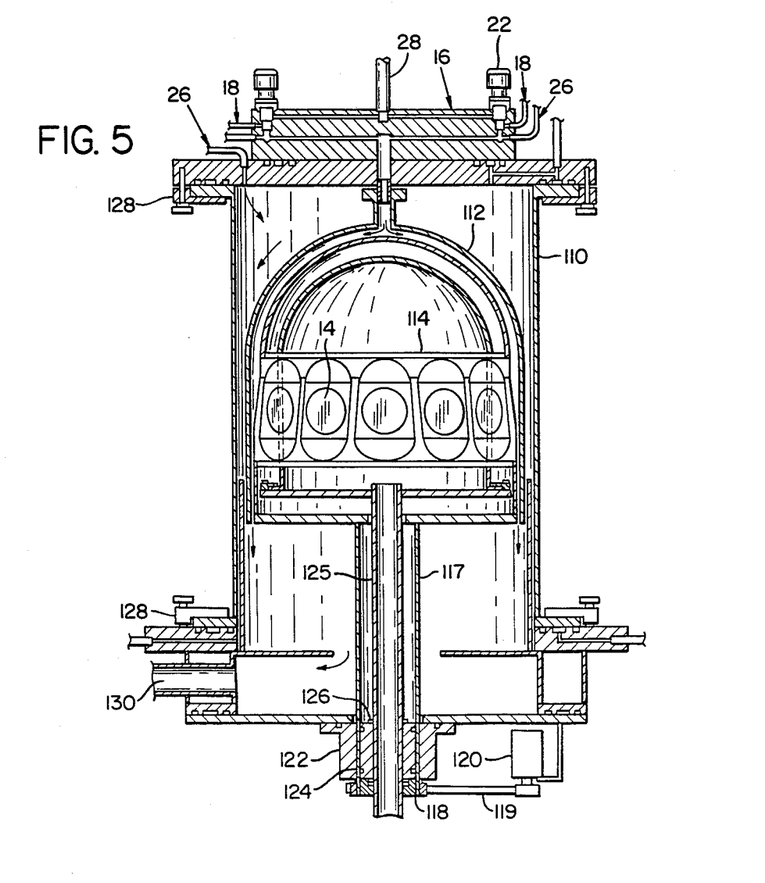
FIG. 5 is a cross-sectional view of a second embodiment of the manifold and process chamber employed in the apparatus of FIG. 1.

A second embodiment of the apparatus 10 which employs the manifold 16 with a vertical process chamber 110 is shown in FIG. 5. As in the first embodiment, gas flows from the gas sources 18 and 26 are injected into the process chamber 110 through the manifold 16 or diverted to the vent chamber 32 (not shown) through vent 28, depending on the process step. Within the chamber 110, a flow channel 112 that receives the gas flows from the manifold 16 comprises a narrow annular passageway defined by a quartz dome set over a graphite carousel 114. An internal heat source (not shown) lies behind the carousel 114 for heating the carousel, thereby heating the substrate wafers 14 carried thereon.

As shown in FIG. 5, the carousel 114 is rotatably supported by a rotating shaft 117 driven via a sprocket 118 and chain 119 by a motor 120. The shaft 117 is supported by a bushing 122 and bearings 124 that enable it to turn free of the bushing. The heat source beneath the carousel 114 rests on a stationary stand 125 that stands free of the shaft 118 via bearings 126. The manifold 16 and base portion of the apparatus including the stand 125, the shaft 117, and the motor 120 are mounted to the process chamber 108 by a number of clamps 128.

The arrows within the flow channel 112 and chamber 110 indicate the direction of gas flow through and out of the flow channel as the carousel 114 rotates. The rotation mixes incoming gas flows and exposes the substrate wafers to different portions of the gas flow for improved uniformity of deposition. The rotation also provides temperature uniformity across the substrate wafers 14. The gases flowing through the channel 112 converge at the chamber outlet 130 as they are drawn from the chamber by the vacuum pump 38 (not shown).

The Method of Operation

The method of operation employed with the apparatus 10 minimizes any "dead space" within the manifold 16 and equalizes the pressures of the process and vent chambers 12 and 32 to produce epitaxial layers of extremely narrow thickness and sharp transitions. Such layers are combined in structures such as laser diodes, optoelectronic devices, and high electron mobility transistors (HEMTs). In this method, equal pressures are achieved by maintaining constant total gas flows through the process chamber 12 and the vent chamber 32 as the reactive gases from gas sources such as source 18 are switched into and out of the process chamber. With a pressure equal to the pressure of the process chamber 12, the vent chamber 32 acts as a pressure damping reservoir to minimize disturbances in the reactive gas flow. Although the gas flow rate should be constant in each chamber 12 and 32 to maintain equal pressure, they need not be equal. The actual flow in each chamber may be different so long as the chamber geometries produce equal pressures.

Figure 6:
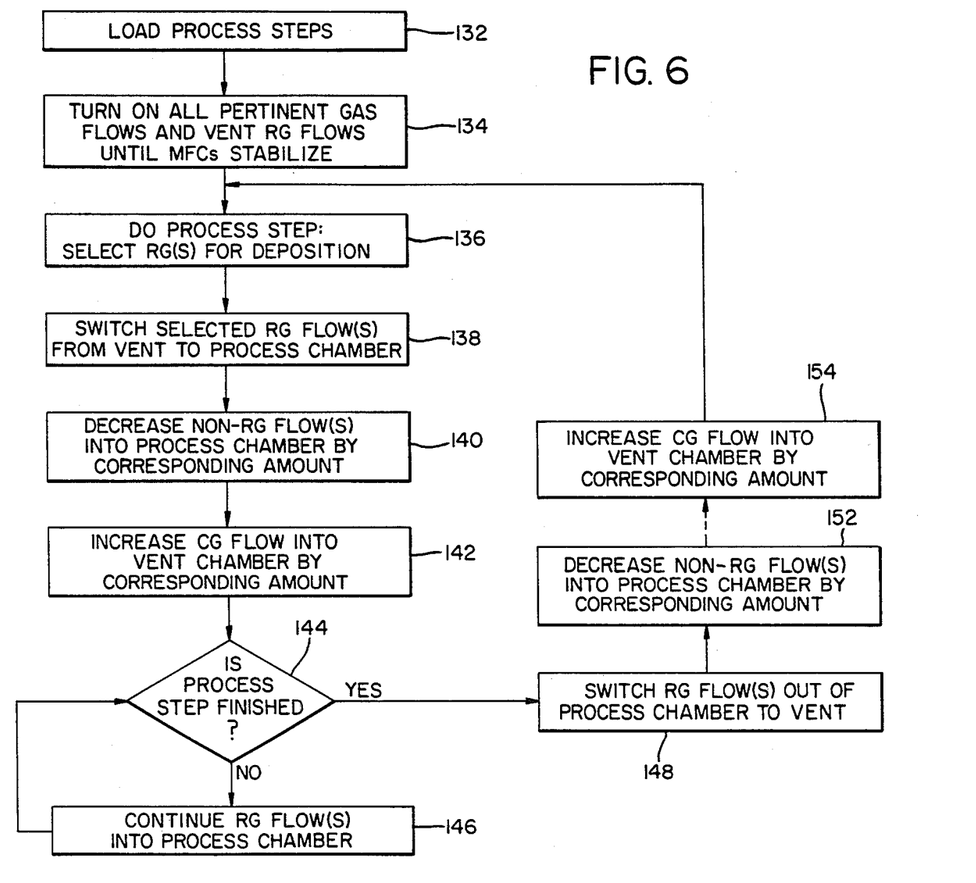
FIG. 6 is a flowchart of a deposition procedure illustrating the method of the invention.

Referring to FIG. 6, a flowchart of the method of operation is shown. This flowchart illustrates the steps taken by the process controller to carry out a deposition run. The process controller 24 may be of any number of commercially available controllers or a microcomputer such as an IBM PC or HP 9836 programmed in suitable fashion.

Initially, the process steps to be carried out for a deposition are loaded and stored (box 132). All pertinent gas flows, both reactive (RG), nonreactive (NRG), and compensating (CG) are turned on, with the reactive gas flows vented to the vent chamber 32 until the MFCs 54a through 54c stabilize (box 134). The nonreactive gas flow through the process chamber 12 is adjusted until the desired constant overall or total flow and thus pressure for the particular deposition is reached. The compensating gas flow into the vent chamber 32 is adjusted accordingly via signals from the pressure transducer 34 to MFC 54c to produce a pressure equal to the pressure in the process chamber 12.

The first process step is initiated by selecting the desired reactive gas flows for the first deposition layer (box 136). One or more reactive gas flows, which can flow at different predetermined rates that depend on the deposition, are then switched into the process chamber 12 to produce a deposition (box 138). The associated nonreactive gas flow through each affected valve 22 is simultaneously decreased a corresponding amount by MFC 54a at the direction of the controller 24 (box 140) to maintain a constant flow per valve and therefore a constant total flow through the process chamber. This action may be taken in response to actual monitoring of the reactive gas flow by the controller 24 or as part of a preprogrammed procedure. Either way, the overall total gas flow into the process chamber 12 is maintained at a constant rate. The compensating gas flow into the vent chamber 32 is increased by a corresponding amount to compensate for the loss of reactive gas flow (box 142) to the process chamber. The deposition in the first process step continues until the step is completed (boxes 144, 146).

Once the first process step is finished, those reactive gas flows not required in the next step are switched to vent (box 148) and the associated nonreactive gas flows into the process chamber are adjusted accordingly, i.e., are increased by a corresponding amount (box 152). A change in the compensating gas flow is also made to maintain the constant flow through the vent chamber (box 154). This process step and the following steps proceed like the first, with the required reactive gas flows selected (box 136) and switched into the process chamber 12 (box 138). As reactive gas flows of different rates are switched into and out of the process chamber 12, the associated nonreactive gas flows are adjusted accordingly so that the total flow into the process chamber remains constant.

It should be understood that many of the steps shown and described as discrete can occur simultaneously or be carried out in principle by other means so long as the constant total flows and thus the constant pressures are maintained in each chamber 12 and 32. For example, a separate nonreactive gas flow may be added to compensate for aggregate changes in the reactive flows, with each individual nonreactive flow associated with a valve 22 maintained at a constant rate solely for purging the "dead space" within the manifold 16.

Figure 7:
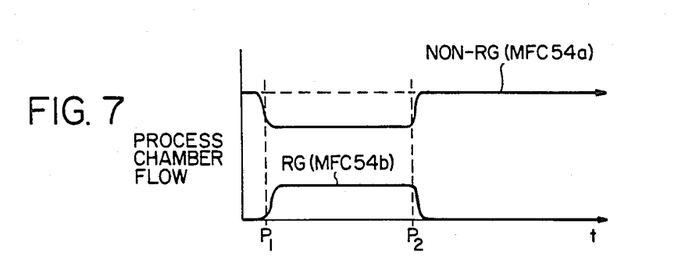
FIG. 7 is a graph illustrating gas flow through the process chamber.
Figure 8:
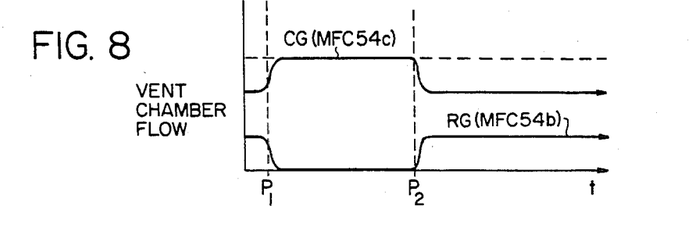
FIG. 8 is a graph illustrating gas flow through a vent chamber employed in the apparatus of FIG. 1.

An example of how the gas flows can change and yet maintain a constant total flow into the process and vent chambers is illustrated by the relative flow rates in FIGS. 7 and 8 for a single reactive gas flow through MFC 54b and valve 22. Before the deposition process begins, the reactive flow is vented and the entire process chamber flow is nonreactive gas. At the first process step P1, the reactive gas flow is switched through the valve 22 into the chamber 12 and out of the vent chamber 32. Simultaneously, the associated nonreactive gas flow is decreased to maintain a constant flow through the valve 22 into the chamber 12. The compensating gas flow is increased to replace the lost reactive flow and maintain a constant total flow into the chamber 32. At the second process step P2, the reactive gas flow is switched out of the process chamber 12 and back to the vent chamber 32. Simultaneously, the nonreactive gas flow is increased to its former level. The compensating gas flow is also decreased to its former level. No substantial pressure fluctuations thus result during either switching. This example is not intended to limit the invention but merely to show that one means for maintaining a constant total flow and thus constant pressure within the process and vent chambers is to maintain a constant flow through each inlet valve 22.

In actual practice, this method and apparatus 10 should produce deposition layers as thin as 50 angstroms, with heterojunction transition thicknesses as thin as 10 angstroms in low pressure operation and 25 angstroms in atmospheric pressure operation.

Having illustrated and described the principles of the invention in the preferred embodiments, it should be apparent to those skilled in the art that the invention can be modified in arrangement and detail without departing from such principles. We claim all modifications coming within the spirit and scope of the following claims.

We claim:

1. An apparatus for depositing materials on a substrate, comprising:
 a process chamber;
 at least one gas source pair providing a compensating gas flow and a separate continuous reactant gas flow;
 manifold means having a pair of inlets for receiving gas flows from the gas source pair and an outlet for directing the gas flows to the process chamber;
 inlet valve means between each of the inlets and the outlet of the manifold means for switching the gas flow from each gas source in the pair into and out of the process chamber, each valve means being located equidistantly from the outlet; and
 means for simultaneously switching one of the compensating gas flow and continuous reactant gas flow into the process chamber as the other of the compensating gas flow and continuous reactant gas flow is switched out of the process chamber to maintain a constant flow through the manifold outlet into the process chamber.

2. The apparatus of claim 1 including a plurality of gas source pairs.

3. The apparatus of claim 1 in which the manifold means comprises a radial manifold, each of the inlets extending radially through the manifold to communicate with the outlet at a common location, the outlet extending axially within the manifold to the common location.

4. The apparatus of claim 1 in which the manifold means includes vent means in communication with the inlet valve means for venting the respective gas flow away from the process chamber in response to actuation of the inlet valve means, the vent means thereby minimizing pressure fluctuations in the gas flow.

5. The apparatus of claim 4 including a metalorganic source, one of the gas sources directing a carrier gas flow through the metalorganic source to carry metalorganic material to the process chamber.

6. The apparatus of claim 4 in which the inlet valve means comprises a three-way valve, an inlet of the valve in communication with the manifold inlet, a first outlet of the valve in communication with the manifold outlet, and a second outlet of the valve in communication with the manifold vent means.

7. The apparatus of claim 4 in which a first and a second inlet are in communication with the outlet at the valve means, the gas flow from the second inlet purging the space within the manifold means between the valve means and the outlet of gas from the first inlet.

8. The apparatus of claim 1 including a flow channel within the process chamber a carrier for mounting the substrate within the flow channel, a first section of the flow channel in communication with the manifold outlet for receiving the gas flows therefrom and a second longitudinal section of the flow channel for funneling the gas flow over the substrate to cause deposition of the material within the gases on the substrate.

9. The apparatus of claim 8 including a ramp within the second section of the flow channel for abutting the substrate carrier to cause the gas flow to rise along the ramp at a predetermined angle to coincide with a leading edge of the substrate carrier and thereby provide laminar flow over the mounted material.

10. The apparatus of claim 9 in which the substrate carrier is wedge-shaped to restrict gas flow through the flow channel and accelerate gas flow over the material.

11. The apparatus of claim 4 including means for maintaining the vent means at a pressure substantially equal to the pressure within the process chamber as gas flows through each inlet are switched between the vent and the outlet to the process chamber.

12. An apparatus for depositing materials on a substrate, comprising:
 a process chamber having an inlet and an outlet;
 a plurality of gas sources for injecting separate flows of gases into the inlet of the process chamber;
 a radial manifold between the gas sources and process chamber and having a plurality of radial inlet paths for receiving gases from the gas source, an outlet path into the inlet of the process chamber, and a vent path away from the inlet of the process chamber, the radial inlet paths meeting the outlet path at a common location within the manifold;

a three-way valve within each inlet path for switching the gas flow into the inlet of the process chamber through the manifold outlet path and away from the inlet of the process chamber through the vent path, each three-way valve located an equal path distance from the process chamber;

a vent chamber having an inlet connected to the vent path of the manifold and an outlet coupled to the outlet of the process chamber; and means for controlling a compensating gas flow into the vent chamber to maintain the vent chamber at a pressure substantially equal to the pressure within the process chamber as gas flows through each radial inlet are switched between the vent path to the inlet of the vent chamber and the manifold outlet to the inlet of the process chamber.

13. The apparatus of claim 12 in which first and a second inlet paths are in communication with an outlet path at the three-way valve so that the gas flow received through the second inlet path purges a space within the manifold between the valve and the process chamber of gas received through the first inlet path.

14. The apparatus of claim 13 including means for controlling gas flow received through the second inlet path in cooperation with the three-way valve to maintain a constant gas flow through the valve.

15. An apparatus for depositing materials on a substrate, comprising:

a process chamber;

at least one gas source pair providing a compensating gas flow and a separate continuous reactant gas flow for injection into the process chamber;

a manifold connected to the process chamber; a valve within the manifold operable to switch one of the gas flows into the process chamber and the other of the gas flows away from the process chamber to maintain a constant gas flow through the manifold outlet into the process chamber;

a vent chamber connected to the manifold to receive the gas directed away from the process chamber; and means for controlling a compensating gas flow into the vent chamber to maintain the vent chamber at a pressure substantially equal to the pressure in the process chamber as gas flows through the manifold are switched by the valve between the process chamber and the vent chamber.

* * * * *

UNITED STATES PATENT AND TRADEMARK OFFICE
CERTIFICATE OF CORRECTION

PATENT NO. : 4,761,269

DATED : August 2, 1988

INVENTOR(S) : Darrell R. Conger et al.

It is certified that error appears in the above-identified patent and that said Letters Patent is hereby corrected as shown below:

Column 1, line 39, "apparatrs" should be --apparatus--.

Column 4, line 60, "sourr:es" should be --sources-- and line 64, "cf" should be --of--.

Column 5, line 31, "54" should be --54a--.

Column 10, line 9, after "constant" insert --gas-- and line 41, after "chamber" insert --and--.

Column 11, line 1, "source" should be --sources--

Signed and Sealed this

Third Day of January, 1989

Attest:

DONALD J. QUIGG

*Attesting Officer*  *Commissioner of Patents and Trademarks*